United States Patent [19]

Nakaoki

[11] Patent Number: 4,528,682
[45] Date of Patent: Jul. 9, 1985

[54] DIGITAL MEASURING INSTRUMENTS

[75] Inventor: Tooru Nakaoki, Tokyo, Japan

[73] Assignee: Mutoh Industry Ltd., Tokyo, Japan

[21] Appl. No.: 239,482

[22] Filed: Mar. 2, 1981

[30] Foreign Application Priority Data

Mar. 14, 1980 [JP] Japan ................... 55-32465
Mar. 22, 1980 [JP] Japan ................... 55-36629
Mar. 22, 1980 [JP] Japan ................... 55-36630

[51] Int. Cl.³ ................................. G06M 3/14
[52] U.S. Cl. ........................... 377/24; 377/44;
377/45; 318/603
[58] Field of Search ...... 235/92 MP, 92 MT, 92 DN,
235/92 CC; 34/347 P; 116/230; 318/603;
377/17, 19, 24, 44, 45

[56] References Cited

U.S. PATENT DOCUMENTS

| | | | |
|---|---|---|---|
| 3,668,377 | 6/1972 | Inaba et al. ................... | 318/603 |
| 3,740,532 | 6/1973 | Esch ............................... | 235/92 EV |
| 3,794,814 | 2/1974 | Lay et al. ....................... | 235/92 EV |
| 3,843,873 | 10/1974 | Beville et al. ................. | 235/92 EV |
| 4,081,661 | 3/1978 | Durbin ........................... | 235/92 EV |
| 4,112,291 | 9/1978 | Fukuyama et al. ........... | 235/92 EV |
| 4,117,320 | 9/1978 | Tomlinson et al. ........... | 340/347 P |

FOREIGN PATENT DOCUMENTS

1277985 6/1972 United Kingdom .
1357260 6/1974 United Kingdom .

*Primary Examiner*—Gary Chin
*Attorney, Agent, or Firm*—Wenderoth, Lind & Ponack

[57] ABSTRACT

In an instrument for converting the rotary motion of the feed shaft of a machine to a pulse train having a direction component and for counting and displaying the pulse train as counted by a reversible counter, a digital measuring device arranged such that its reversible counter does not count pulses generated by the idling rotation of the feed shaft due to play in the feed system of the machine, thereby digitally counting and displaying the correct transfer distance or feed ratio of the transfer unit of the machine.

3 Claims, 14 Drawing Figures

DIGITAL MEASURING INSTRUMENTS

BACKGROUND OF THE INVENTION

The present invention relates to digital measuring instruments and more particularly to a digital measuring instrument which is mounted on the feed shaft of machine tools with which it is used.

The digital measuring instruments displaying the number of revolutions of the feed shaft of the machine tools is known to the art by U.S. Pat. No. 4,117,320 and British Pat. No. 1,499,504. The feed system of the machine tools in general is constructed in such a way that threads are formed on a feed shaft and a nut is screwed into the threads, and the nut is coupled to a transfer unit. Another general construction of the feed system of the machine tools is an arrangement such that a gear is fixed to a feed shaft, and the gear is meshed with a rack, and the rack is coupled to a transfer unit. In the foregoing construction, when the feed shaft is rotated, the transfer unit is transferred in a linear direction. Accordingly, when the digital measuring instrument is mounted on the feed shaft, the rotary motion of the feed shaft is converted to pulse signals and the pulse signals are counted by a reversible counter, and the transfer distance or feed ratio of the transfer unit is then digitally displayed. However, as is well known, a backlash phenomenon exists; namely, there is a play (clearance) which exists between the thread and the nut or between the gear and the rack which form the feed system of the machine tool. For this reason, when the direction of rotation of the feed shaft is reversed, even if the feed shaft is rotated, a phenomenon occurs wherein the transfer unit is not transferred in the linear direction due to the play in the feed system. Accordingly, in the case where the conventional digital measuring instrument is mounted on the feed shaft of the machine tool, the non-load rotary motion of the feed shaft due to the play in the feed system of the machine tool is digitally counted. Consequently, the conventional digital measuring instrument brings about an inconvenience in that the accurate transfer distance of the transfer unit is not displayed. The non-load rotation of the feed shaft due to the play in the feed system is generated when the direction of rotation of the feed shaft is reversed. For this reason, in general, the feed shaft is caused to turn in a direction which eliminates any influence due to the play in the feed system, and then, the counter of the digital measuring instrument is reset to zero so as to effect the standard setting, and thereafter, the feed operation is started in only one direction. In the case wherein the transfer unit is fed in the opposite direction, the influence of the play in the feed system is again removed by the foregoing manner; namely, the counter is reset to zero and the feed operation then started in the opposite direction. As will be obvious from the foregoing description, the operation of eliminating the influence of the play in the feed system whenever the direction of rotation of the feed shaft is reversed is an extremely cumbersome work, giving a rise to an extreme deterioration of the operation efficiency.

SUMMARY OF THE INVENTION

A primary object of this invention is to provide digital measuring instruments to count the transfer distance digitally and accurately without performing the standard setting operation in order to specifically eliminate the influence of the play in the feed system whenever the direction of rotation of the feed shaft is reversed.

Another object of this invention is to count the transfer distance of the transfer unit digitally and accurately by connecting a direction discriminating circuit to an encoder for converting the rotary motion of the feed shaft to digital pulses, and by connecting a preset counter which has previously been set to a digital valve corresponding to the play of the feed system to an output terminal of the discriminating circuit, and by connecting an output terminal of the preset counter to a control unit for switching a gate of an input gate circuit of a reversible counter, and by outputting signals for enabling the gate of the input gate circuit by the preset counter when the absolute value of the input pulses in clockwise and counterclockwise directions to the preset counter, which are generated by the rotation of the feed shaft, exceeds a preset value based on the conversion time of the direction of rotation of the feed shaft as a standard, and by outputting signals for disabling the gate of the input gate circuit by the preset counter until the absolute value of the input pulses reaches the preset value.

Still another object of this invention, in the instruments wherein the rotary motion of the feed shaft of the machine tool is converted to the digital signals by the encoder and the digital signals are digitally counted by the reversible counter, is to provide a transfer detecting device to detect the transfer of the transfer unit of the machine tool whereby the gate of the input gate circuit of the reversible counter is enabled by the transfer detecting signals of the transfer detecting device, and the gate of the input gate circuit is disabled by the stop detecting signal of the transfer detecting device, and the output pulses of the encoder due to the play rotation of the feed shaft of the machine tool are not counted by the reversible counter, and the transfer distance of the transfer unit is accurately and digitally counted.

The drawings show preferred embodiments of this invention. However, it is possible to produce various modifications from the construction disclosed in this specification, and it should not be interpreted that the drawings and the description define or limit the scope of this invention. The preset counter used particularly in this invention includes a memory and arithmetic circuit in addition to commercially available preset counters and further includes an electronic circuit equipped with functions identical to that of a commercially available preset counter.

DESCRIPTION OF THE PREFERRED EMBODIMENTS

Figure 1:
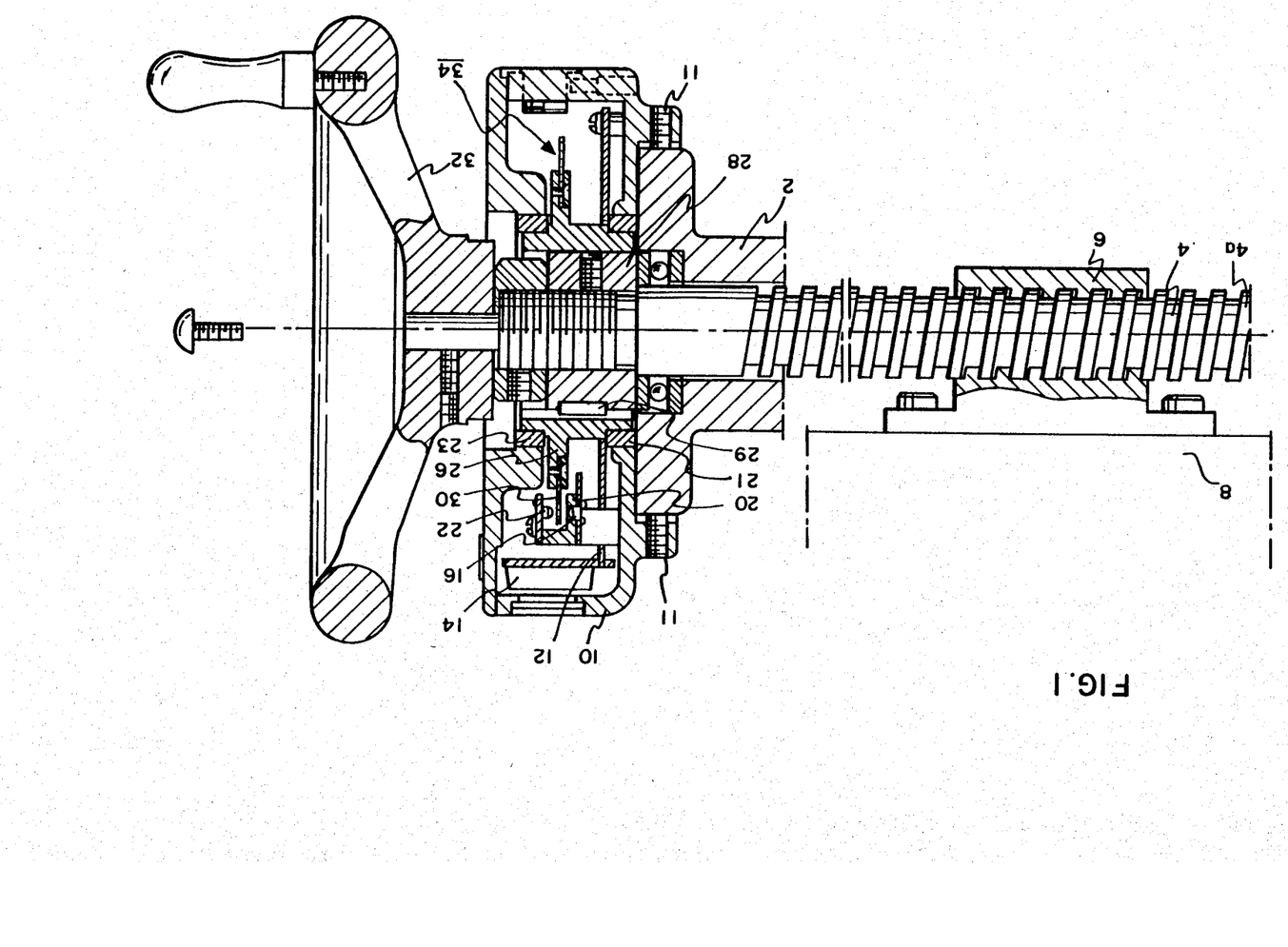
FIG. 1 is a cross section showing an internal structure of this instrument.

In FIG. 1, reference numeral 2 denotes a bearing member provided on the machine body of the machine tool, and a feed shaft 4 is rotatably supported on this bearing member. Reference numeral 6 denotes a nut member screwed onto a threaded portion 4a of the feed shaft 4, and the member 6 is fixed to a tool slide 8. The threaded portion 4a and the nut member 6 constitute the feed system of the machine tool.

Reference numeral 10 denotes a casing, and an encoder 34 is self contained in the casing 10. The casing 10 is detachably fixed to a flange portion of the bearing member 2 by means of an adjusting screw 11.

Reference numeral 12 denotes a plate member fixed to the casing 10, and a digital display device 14 is fixed to the plate member 12, and a display unit of the display device 14 is positioned immediately below a window formed on the casing 10. Reference numerals 16 and 18 denote two light receiving elements disposed in the casing 10, and a known stationary slit plate 20 is disposed in front of the light receiving elements. Reference numerals 22 and 24 denote two light emitting elements disposed on the plate member 12 fixed to the casing 10, and the light emitting elements 22 and 24 and light receiving elements 16 and 18 are opposed to each other at predetermined intervals. Reference numerals 21 and 23 denote ringlike bushings fitted and fixed to holes of the casing 10, and the outer periphery of a rotary body 26 is rotatably fitted to the inner periphery of the bushings. On the inner periphery of the rotary body 26, a keyway is formed along the axial direction, and a key 29 projected on the outer periphery of a collar 28 is fitted to the keyway. The collar 28 is fixed to the feed shaft 4 by means of a screw. Reference numeral 30 denotes a known ringlike slit plate fixed to the flange portion of the rotary body 26, and the slit plate 30 is positioned at an intermediate position between the light receiving elements 16 and 18 and the light emitting elements 22 and 24. The light emitting elements 22 and 24 and light receiving elements 16 and 18, slit plate 30 and stationary slit plate 20 constitute an encoder 34. Reference numeral 32 denotes a handle which is detachably fixed to one end of the feed shaft 4.

Figure 2:
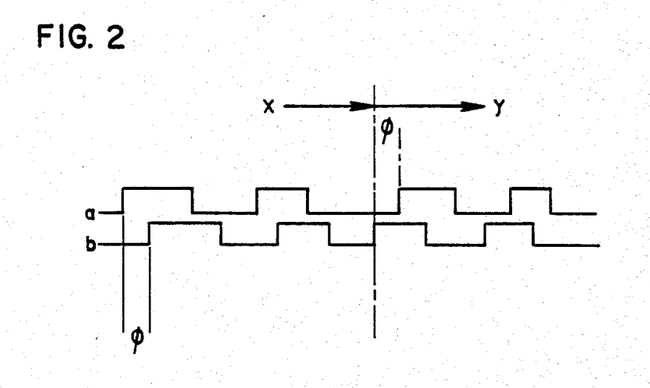
FIG. 2 is an explanatory drawing showing output pulses of an encoder.
Figure 3:
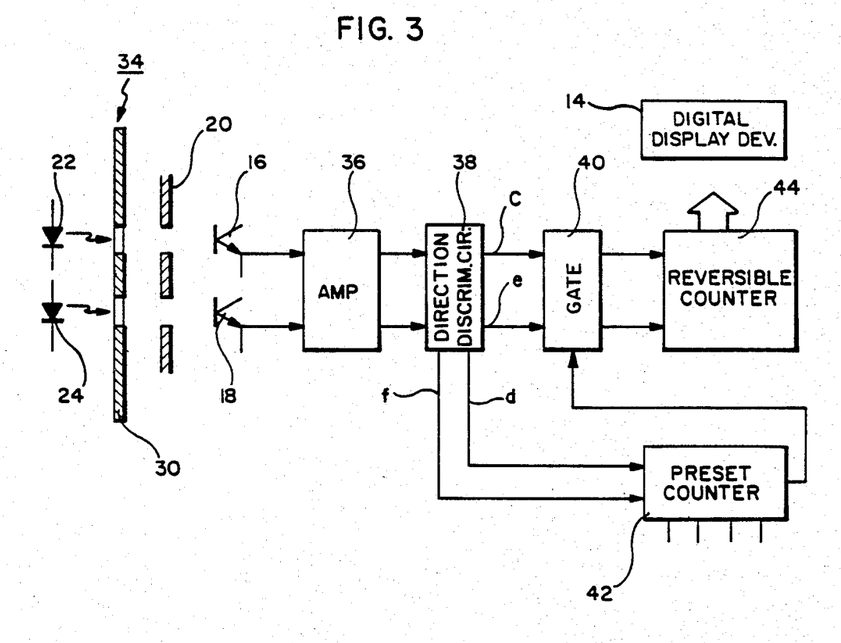
FIG. 3 is a block diagram for the explanation of an electronic circuit of this instrument.

FIG. 3 is a block diagram for the explanation of an electronic circuit of this invention. In the diagram, reference numeral 36 denotes a waveform shaping and amplifying circuit, and numeral 38 denotes a direction discriminating circuit; circuit 38 determines the directional component of the output pulse, namely, the transfer of the phase of the pulse, and converts the output pulse of the amplifying circuit 36 to an output pulse which is suitable for use as an input pulse of a reversible counter on the basis of the result of the determination of the direction. That is, the transfer of the phase of the pulse means that, for example, in FIG. 2, with the chained line of vertical direction as the border, the phase of the pulse row a of the left side is led by $\phi°$ from the phase of the pulse row b. Also, in the portion at the right side from the chained line, the phase of the pulse row a is lagged by $\phi°$ from the phase of the pulse row b. As described in the foregoing, the lead or lag of the phase of the pulse is represented by that the phase of the pulse shifts. In FIG. 2, the chained line shows the rotation converting point of the feeding shaft. The discriminating circuit 38 is constructed in such a way that when the direction of the output pulse of the encoder 34 is in the clockwise direction, a pulse appears at the terminals c and d of the direction discriminating circuit 38, and when the direction of the output pulse of the encoder 34 is in the counterclockwise direction, a pulse appears at the terminals e and f of the direction discriminating circuit 38. The one output terminal c of the direction discriminating circuit 38 is connected to an up count terminal of the reversible counter 44 through the counter input gate circuit 40, and the other output terminal d is connected to an up count terminal of the preset counter 42. The terminal e of the direction discriminating circuit 38 is connected to a down count terminal of the reversible counter 44 through the gate circuit 40, and the output terminal f of the direction discriminating circuit 38 is connected to the down count terminal of the preset counter 42. A preset digital value is input to the preset counter 42; this value corresponds to the amount of the backlash or the amount of the play of the feed system of the machine tool which has been previously measured, for example, a digital value corresponding to 20 microns. The output terminal of the preset counter 42 is connected to the gate switching control unit of the counter input gate circuit 40. The preset counter 42 stops the counting operation when the counted value of the pulse inputted to its up count terminal is coincident with its preset value and outputs an energizing signal to the gate circuit 40; and thereafter, even if a pulse is inputted to its up count terminal, the count value at the stop time of the counting is maintained. Also, the preset counter 42 subtracts the pulse from the counted value when the pulse is inputted to its down count terminal. When the count becomes zero by the subtraction, the energizing signal is outputted to the gate circuit 40, and thereafter, even if a pulse is inputted to its down count terminal, the subtracting operation is stopped, and the zero counted is maintained. Also, the preset counter 42 is constructed in such a way that when its counted value becomes a value between the zero and the preset value, namely, if $O<C<P$, C being the counted value and P being the preset value, then a disabling signal is outputted to the gate circuit 40 to inhibit count pulses from being fed to the counter 44. The reference numeral 14 denotes a display device. Although the display device 14 and the electronic circuit unit are shown as being mounted in the casing 10, this equipment can be mounted in a casing separate from the casing 10.

Next, the operation of the embodiment of this invention will be described.

When the handle 32 is turned manually which turns the feed shaft 4 and the slit plate 30, the light receiving elements 16 and 18 generate the sine waves whose phases are mutually shifted by 90°. The sine wave outputs are shaped into pulses whose phases are shifted by 90°, as shown in waveforms a and b of FIG. 2, by the waveform shaping and amplifying circuit 36. When the slit plate 30 is turned in a clockwise direction, the phase of the pulse train a is advanced by $\phi$ with respect to the pulse train b, and when the slit plate 30 is turned in a counterclockwise direction, the phase of the pulse train a is delayed by $\phi$ with respect to the pulse train b. The advancement and delay of the phase determine the direction of the pulse trains a and b. By the way, with respect to the direction of rotation of the slit plate 30, as shown in FIG. 2, the clockwise rotation is shown by x and the counterclockwise direction is shown by y. The pulse trains a and b are inputted to the direction discriminating circuit 38, and the direction component is detected by the direction discriminating circuit 38; if the direction of the pulse trains a and b is in a clockwise rotation, then the pulses appear at the up count terminals c and d, and if the direction of the pulse trains is in a counterclockwise direction, then the pulses appear at the down count terminals e and f. Now, the description is provided for the case where the pulses appear at the output terminals c and d. When the handle 32 is turned in the clockwise direction of rotation, the play of the feed system is eliminated, and then the handle 32 is stopped, and the reversible counter 44 is reset to zero. Moreover, when the handle 32 is turned in the clockwise direction, the pulses appear at the output terminals c and d of the circuit 38. The pulses which appear at the output terminal c are transmitted to the gate circuit 40, and the pulses from the up count terminals c and d are inputted to the up count terminal of the reversible counter 44. As the result, the pulses are added to the count in the reversible counter 44, and the result of the addition is digitally displayed on the display device 14. Also, the pulses transmitted from the output terminal of the direction discriminating circuit 38 to the preset counter 42 are inputted to the up count terminal of the preset counter 42. When the handle 32 is turned in the counterclockwise direction so as to cause the pulses to appear at the output terminals e and f of the direction discriminating circuit 38, the pulses are inputted to the reversible counter 44 and the down count terminal of the present counter 42, whereby the pulses are subtracted from the count in the reversible counter 44, and the count in the reversible counter 44 is displayed on the display device 14. The operation of reversing the direction of rotation of the handle 32 in the counterclockwise rotation will be described. When the feed shaft 4 is turned in the counterclockwise direction, a pulse appears at the output terminal f of the direction discriminating circuit 38, and the pulse is inputted to the the down count terminal of the preset counter 42. The preset counter 42 subtracts the input pulse and when a relationship of $0 < C < P$ is established between the subtracted value C and the preset value P, a disable signal is outputted to the gate switching control unit of the gate circuit 40. Namely, when the handle 32 is turned so as to reverse the direction, the counting operation of the reversible counter 44 is stopped immediately. When the absolute value of the subtracted value of the preset counter 42 is coincident with the preset value, namely, when the subtracted value becomes equal to zero, the preset counter 42 outputs the energizing signal to the gate switching control unit of the gate circuit 40, and thereafter, even if a pulse is inputted to the down count terminal, the zero count is maintained. When the gate of the gate circuit 40 is energized, the reversible counter 44 initiates its subtraction. The contents of the reversible counter is digitally displayed on the display device 14. When the handle 32 is turned in the counterclockwise direction from the clockwise direction, the feed shaft 4 is turned, and pulses are outputted from the encoder 34, but the nut member 6, namely, the tool slide 8, remains in an immovable condition due to the play of the feed system. However, when such an immovable condition is produced, the supply of pulses to the reversible counter 44 is stopped, and the reversible counter 44 does not count the output pulses of the encoder 34. When the tool slide 8 initiates the transfer by following the rotation reversal of the feed shaft 4, a pulse is simultaneously supplied to the reversible counter 44. Accordingly, the influence of the backlash (play) of the feed system is eliminated, and the display device 14 can accurately display the feed ratio of the tool slide 8.

By the way, in case the handle 32 is reversed from the counterclockwise direction to the clockwise direction, the pulse is inputted to the up count terminal of the preset counter 42, and the preset counter 42 counts up the pulses from a zero count. When the pulse is inputted to the up count terminal, the preset counter 42 immediately outputs the signal which disables the gate circuit 40, and this output signal continues while the count value of the preset counter 42 is smaller than the preset value. When the input pulse to the up count terminal increases the count so as to be coincident with the preset value, the preset counter 42 outputs the enabling signal to the gate circuit 40, and also stops the counting operation of the input pulses to the up count terminal, and retains the count value at the stop time.

As will be obvious from the foregoing description, the preset counter 42 constitutes the counter input gate automatic control means that disables the counter input gate circuit during the idling rotation of the feed shaft 4, and when the tool slide 8 starts to transfer by the rotation of the feed shaft 4, the counter input gate circuit is enabled.

Figure 4:
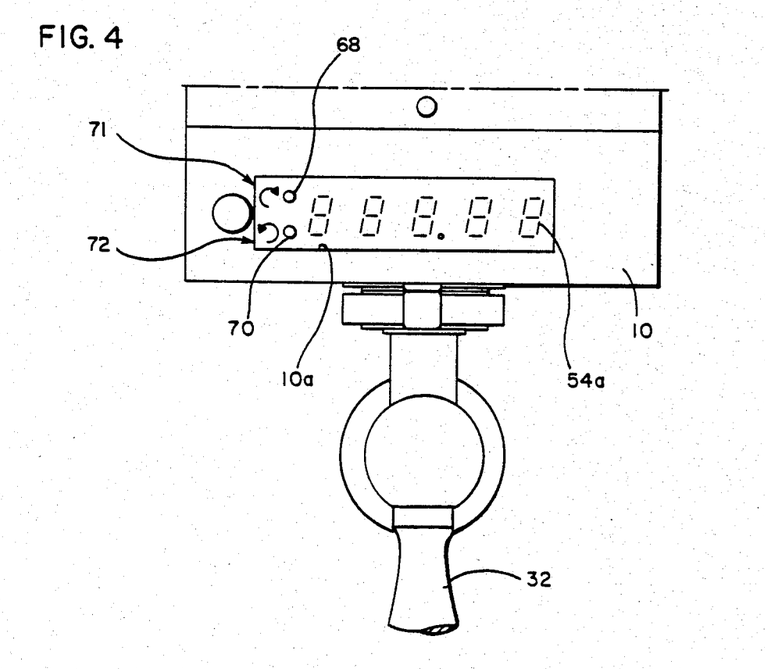
FIG. 4 is a plan of a casing.
Figure 5:
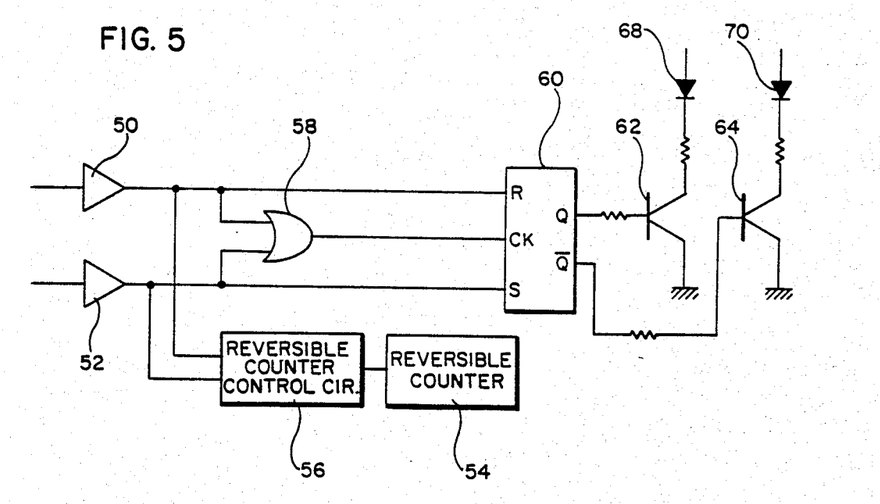
FIG. 5 is a block diagram for the explanation of a direction signal producing circuit.
Figure 6:
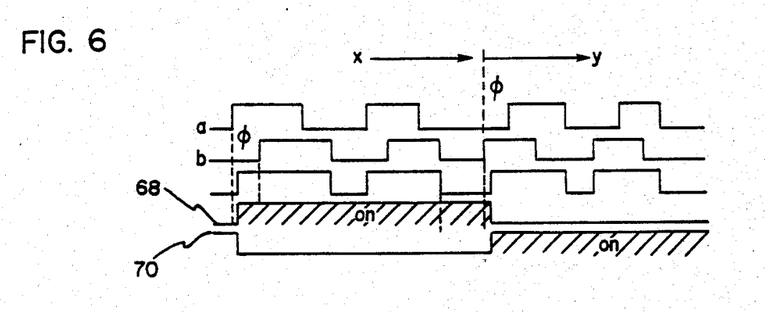
FIG. 6 is an operation explanatory drawing of a direction signal producing circuit.

Next, referring to FIGS. 4 through 6, the description of the rotating direction indicating device of the feed shaft will be provided.

Schmidt trigger circuits 50 and 52 are connected to the pair of light receiving elements 16 and 18 of the encoder 34. Reference numeral 54 denotes a reversible counter, and the Schmidt trigger circuits 50 and 52 are connected to the input terminals of a reversible counter 54 by means of the reversible counter control circuit 56. A display unit 54a of the reversible counter 54 is disposed immediately below the window 10a of the casing 10 and is fixed to the casing 10. Reference numeral 58 denotes an OR circuit, and numeral 60 denotes a direction detecting circuit consisting of ICs, and the circuit 60 is constructed in such a way that when the pulse is inputted to the CK terminal, provided that the R terminal is in a high state, namely, a "1" condition and the S terminal is in a low state, namely, a "0" condition, the Q terminal output becomes a high level and the $\overline{Q}$ terminal output becomes a low level. When a pulse is inputted to the CK terminal, and provided that the R terminal is in the low condition, and the S terminal is in the high condition, the Q terminal output becomes low and the $\overline{Q}$ terminal output becomes high. Reference numerals 62 and 64 denote switch circuits consisting of NPN transistors; the collectors of the transistors are connected to the cathodes of light emitting diodes 68 and 70, and the emitters are connected to ground, and the basis are connected to the Q terminal and $\overline{Q}$ terminal of the IC circuit 60 by means of resistors as shown in the drawing. The anodes of the diodes 68 and 70 are connected to a power source. The diodes 68 and 70 are disposed immediately below the window 10a, and the window 10a is provided with direction indicators 71 and 72 in correspondence with the diodes 68 and 70. The electronic circuit and the device are housed in the casing 10. The direction indicators 71 and 72, operated in correspondence with the light emitting diodes 68 and 70, constitute the direction display unit, but the display unit displaying the direction of rotation of the handle is not particularly limited to this construction.

Next, the operation of the embodiment according to this invention will be described.

When the handle 32 is turned manually, sine waves whose phases are shifted by 90° are generated in the light receiving elements of the encoder. The sine wave outputs are processed by the Schmidt trigger circuits 50 and 52 and the pulses whose phase are shifted by 90° as shown in FIG. 6a and 6b are formed. When the handle 32 is turned in a clockwise direction, namely, the x direction of rotation, so as to turn the slit plate in a clockwise direction, the pulse a is advanced in phase by $\phi$ relative to the pulse b as shown in FIG. 6. When the handle 32 is turned in a counterclockwise direction so as to turn the slit plate in the counterclockwise direction, namely, the y direction, the pulse a is delayed in phase by $\phi$ relative to the pulse b. The advancement and delay of the phase $\phi$ indicates the direction of rotation of the slit plate of the encoder. The pulses a and b are inputted to the OR circuit 58 and the output of the circuit 58 is inputted to the CK terminal of the IC circuit 60. Also, the pulse a is inputted to the R terminal of the IC circuit 60, and the pulse b is inputted to the S terminal of the IC circuit 60. In case the handle 32 is turned in the clockwise direction, the Q terminal of the IC circuit 60 becomes high, and the $\overline{Q}$ terminal becomes low, and these states are maintained. In the condition where the Q terminal is high, the switch circuit 62 is energized, and the light emitting diode 68 is lit, and the direction of rotation of the handle 32 displays the fact that the rotation is in a clockwise direction. Even if the handle 32 is stopped, the 1 and 0 conditions of the output terminals Q and $\overline{Q}$ of the IC circuit 60 are maintained. Accordingly, the operator knows that the direction of rotation of the handle 32 before the stop of the handle 32 was in the clockwise direction. When the handle 32 is turned in the counterclockwise direction, the output of the Q terminal of the IC circuit 60 is reversed to low and the output of the $\overline{Q}$ terminal is reversed to high, and the switch circuit 62 is deenergized, and the switch circuit 64 is energized and the light emitting diode 68 is turned off, and the light emitting diode 70 is lit to display the fact that the handle 32 is being rotated in the counterclockwise direction. This display is maintained even if the handle 32 is stopped. On the other hand, the output pulses of the Schmidt circuits 50 and 52 are inputted to the control circuit 56, and the pulse number is multiplied by the pulse step-up circuit, and the direction components of the pulses a and b are determined, and the pulses are inputted to the up count terminal or down count terminal of the reversible counter 54 according to the determined direction, and the number of revolutions of the feed shaft, namely, the feed ratio of the tool slide, is digitally displayed on the numerical display unit 54a.

Next, during the rotation of the feed shaft, the counter input gate circuit is enabled, and the tool slide starts to transfer by the rotation of the feed shaft, the counter input gate circuit is enabled by the counter input gate automatic control means, and another embodiment of the counter input gate automatic control means will be described by referring to FIGS. 7 and 8.

Reference numeral 78 denotes an encoder and numeral 80 denotes a supersonic oscillating device, and numeral 82 denotes a supersonic receiving device, and these devices 80 and 82 are disposed at proper locations of the casing. Reference numeral 84 denotes a holding and comparing circuit, and numeral 86 denotes an amplifying circuit, and numeral 88 denotes a counter input gate circuit, and numeral 90 denotes a reversible counter, and numeral 92 denotes a digital display device, and these circuits and the devices are disposed in the casing. Reference numeral 8 denotes a tool slide. The supersonic oscillating device 80, receiving device 82 and the circuit 84 constitute the counter input gate automatic control means. By the way, the means is not particularly limited to the use of supersonic waves.

Next, the operation of this embodiment will be described.

When the handle 32 is manually turned to rotate the feed shaft, sine waves are generated whose phases are mutually shifted by 90° by the light receiving elements of the encoder 78. The sine wave outputs are shaped into pulses whose phases are mutually shifted by 90° by a waveform shaping and amplifying circuit (not shown in the drawing), and then inputted to the input gate 88.

On the other hand, the supersonic waves are transmitted towards the tool slide 8 continuously at a predetermined time interval from the supersonic oscillating device 80. This supersonic wave 94 reflects by colliding with the surface of the tool slide 8, and reaches the receiving device 82. The receiving device 82 outputs the pulse signal 96 whenever the supersonic wave 94 is received. The holding and comparing circuit 84 receives the output of the receiving device 82 and counts the supersonic wave receiving interval time and holds the count signal, and on the other hand, performs the comparison of the preceding count signal $t_2$ and the present count signal $t_1$, namely, performs the arithmetic operation of $t_2-t_1$. In case of the condition $t_2-t_1=0$, the output signal of the circuit 84 becomes "O", and in this condition, the input gate circuit 88 is set in the non-enabled condition. In the condition of $t_2-t_1\neq0$, namely, when the tool slide 8 starts to transfer, the output signal of the circuit 84 becomes "1", the signal is inputted to the control terminal of the input gate 88 through the amplifying circuit 86, and the input gate circuit 88 becomes enabled. When the input gate circuit 88 becomes enabled, the output pulses of the encoder 78 are inputted to the reversible counter 90. The output pulses of the encoder 78 are inputted to the up count terminal of the counter 90 when the slit plate is rotated in the clockwise direction, and when the slit plate is rotated in the counterclockwise direction, the output pulses are inputted to the down count terminal of the counter 90. The count stored in the counter 90 is digitally displayed on the display unit of the display device 92 provided in the casing or in a casing provided separately.

Figure 9:
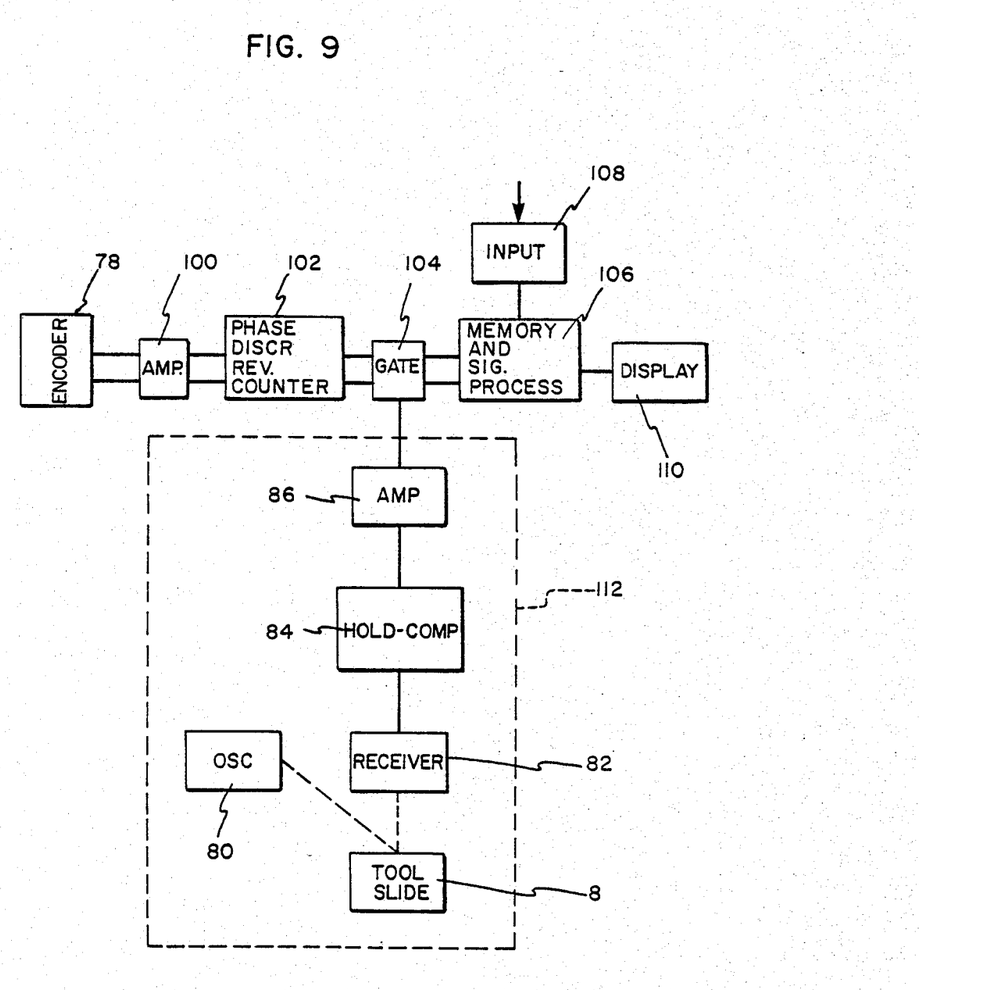
FIG. 9 is a block diagram for the explanation of another embodiment of this invention.

Next, another embodiment will be described by referring to FIG. 9.

Figure 7:
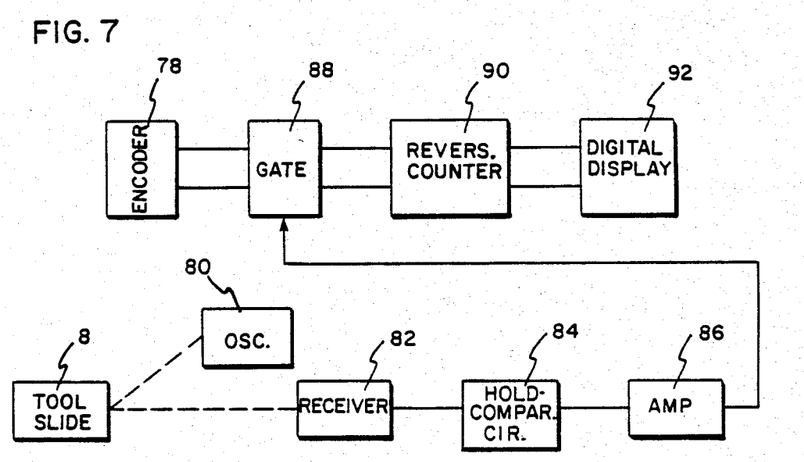
FIG. 7 is a block diagram for the explanation of a transfer detecting device.
Figure 8:
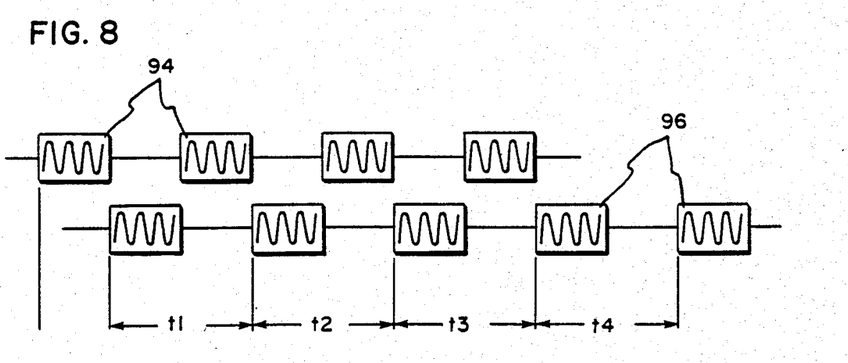
FIG. 8 is a drawing for the explanation of the operation of a transfer detecting device.

Reference numeral 78 denotes an encoder, and numeral 100 denotes an amplifying circuit and numeral 102 denotes a phase discriminating reversible counter and numeral 104 denotes an input gate circuit, and numeral 106 denotes a memory and signal processing device, and numeral 108 denotes a numerical input device, and numeral 110 denotes a display device, and numeral 112 denotes a table transfer detecting device, and the construction is identical with one shown in FIG. 7.

In the foregoing construction, a precision measuring device, such as linear scale for the accurate measurement of the feed ratio of the tool slide 8, is prepared. When the handle 32 is turned from the standard position to read the absolute value of the actual feed ratio of the tool slide 8 corresponding to the count value of the reversible counter 102 by the precision measuring device, the actual feed ratio of the tool slide 8 corresponding to the address signal is sequentially inputted from the input device 108 to the processing device 106 for each output of the reversible counter 102, namely, the address signal on the basis of the read value.

The input gate circuit 104 is energized only in the case where the tool slide 8 is transferred, and in the case where the tool slide 8 is stopped, the circuit becomes disabled. The inputting operation is performed both when the handle is turned in the clockwise direction and when the handle is turned in the counterclockwise direction.

In the foregoing construction, when the handle is turned and the feed screw is turned, the pulse signal is transmitted to the phase discriminating reversible counter through the amplifying circuit from the encoder 78, and the pulse signal is counted by the counter 102. The count output of the counter 102, namely, the address signal and the direction signal are inputted to the processing device 106 through the input gate circuit 104 when the tool slide 8 is in the transfer condition. The processing device 106 calls the measured value information corresponding to the address signal on the basis of the address signal and the direction signal, and displays this information on the display device 10. The data displayed on the display device 110 is based on the result of the actual measurement of the transfer of the tool slide 8, and the display error due to the backlash of the feed system of the machine tool is eliminated. By the way, when the feed ratio display of the tool slide 8 is desired to be reset at an optional position, the display numerical value of the display device 110 may be inputted to the processing device 106 as the subtraction signal from the input device 108. The processing device 106 is programmed to hold the subtraction instruction until the device is reset.

Figure 10:
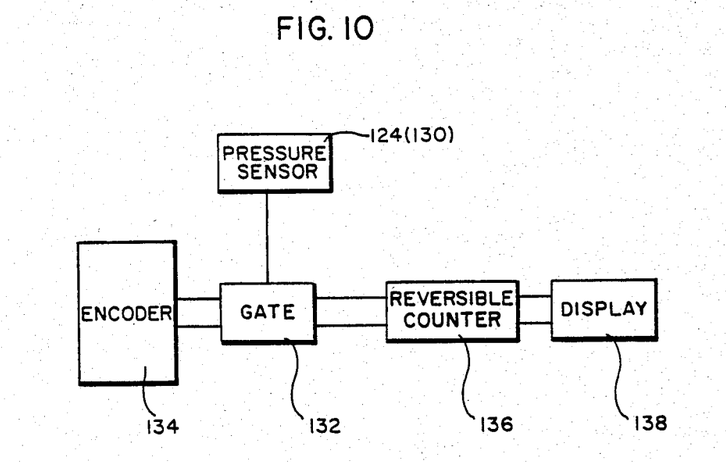
FIG. 10 is a block diagram showing another embodiment of this invention.
Figure 11:
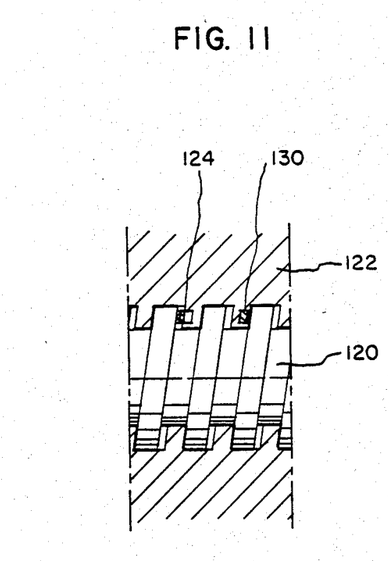
FIG. 11 is a cross section of a feed system of machine tool.
Figure 12:
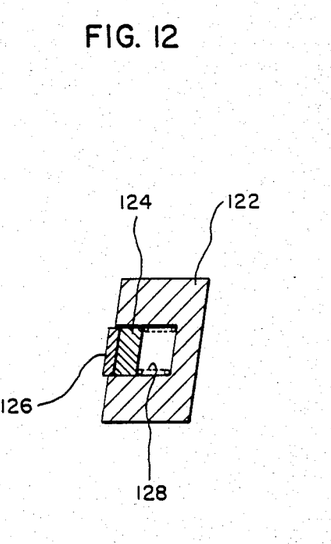
FIG. 12 is a cross section showing another embodiment of the transfer detecting device.

Next, another embodiment of the counter input gate automatic control means will be described by referring to FIGS. 10 through 12.

Reference numeral 120 denotes a nut member of a feed shaft 122, and a groove is formed on one surface of the screw thread of the nut member, and a pressure sensor 124 is disposed in the groove, and a hardened part 126 is fixed to the pressure sensor 124, and the part 126 is caused to project outwardly to a certain degree from one surface of the screw thread by elasticity of a buffer coil spring 128 disposed in a compressed mode in the groove. On another surface of the screw thread of the nut member 122, a pressure sensor 130 is disposed in the similar arrangement. The pressure sensors 124 and 130 are connected to a control terminal of an input gate circuit 132, and when one of the pressure sensors 124 or 130 transmits a predetermined output signal, the input gate circuit 132 becomes enabled; when the predetermined output signal of the sensors 124 and 130 is not generated, the gate circuit 132 is set to become disabled. Reference numeral 134 denotes an encoder, and numeral 136 denotes a reversible counter, and numeral 138 denotes a display device.

In the foregoing construction, when the handle is turned in counterlockwise direction from clockwise direction, the condition where the nut member 122 is static is produced even if the feed shaft 120 is turned due to the backlash between the nut member 122 and the feed shaft 120. In this condition, a pressure is not applied to the pressure sensors 124 and 130, and the input gate circuit 132 becomes disabled. Accordingly, even if a pulse is generated from the encoder 134 in the condition where the nut member 122 is in static condition, the counter 136 does not count the pulse.

When the counterclockwise rotation of the handle exceeds a predetermined quantity, the wall surface of the screw thread of the feed shaft 120 comes to contact tightly with one surface of the screw thread of the nut member 122, and the nut member 122 starts to transfer, and the pressure sensor 124 disposed on one surface of the nut member 122 transmits the predetermined output signal, and the counter 136 starts the counting of the output pulse of the encoder 134.

Figure 13:
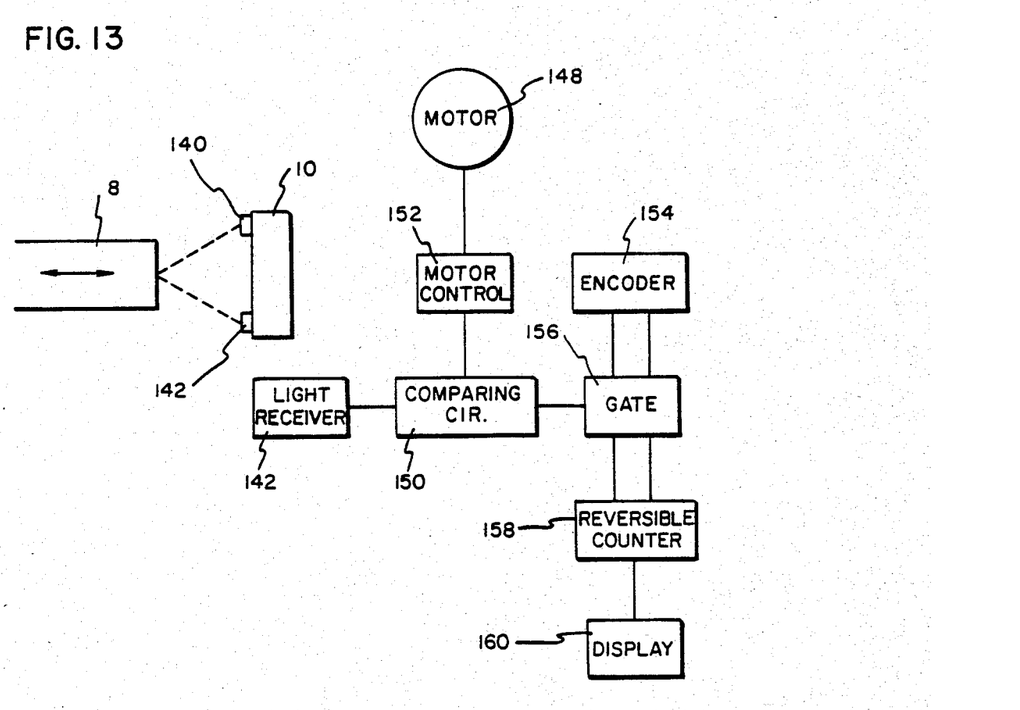
FIG. 13 is a block diagram for the explanation of another embodiment of this invention.

Next, another embodiment of the counter input gate automatic control means will be described by referring to FIG. 13.

Figure 14:
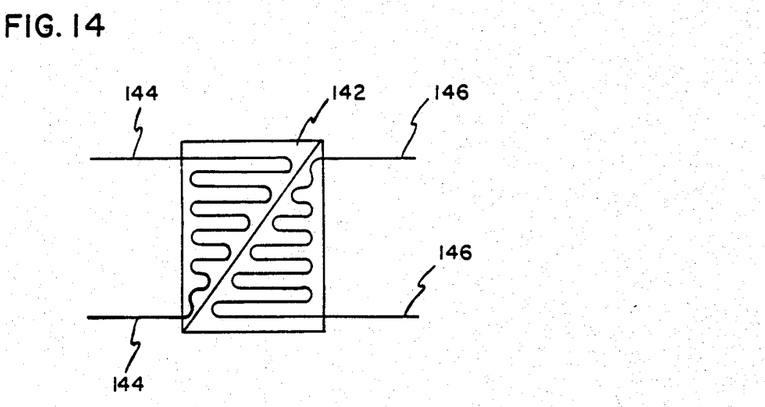
FIG. 14 is an explanatory drawing of the operation of this invention.

Reference numeral 140 denotes a light emitting device disposed in the casing 10, and numeral 142 denotes a light receiving device disposed in the casing 10, and is provided with two output units 144 and 146 as shown in FIG. 14. The output units 144 and 146 generate a output of the same magnitude when the light flux just crosses the center of the device 142 and when the light flux is shifted in the vertical direction in FIG. 14, the balance of the magnitude of the outputs of the output units 144 and 146 is arranged to be lost. The light receiving device 142 is constructed to be controlled with respect to the transfer by the rotation of the output shaft of a motor 148, and the motor 148 is constructed to control the light receiving device 142 with respect to the transfer in a direction where the output of a comparing circuit 150 becomes zero. Reference numeral 152 denotes a motor control circuit, and numeral 154 denotes an encoder, and numeral 156 denotes an input gate circuit, and numeral 158 denotes a reversible counter, and numeral 160 denotes a display device.

In the foregoing construction, the light beam emitted toward the reflecting surface of the tool slide 8 from the light emitting device 140 is reflected by colliding with the reflecting surface, and enters the light receiving device 142. When the tool slide 8 is stopped, since the magnitudes of the outputs of the output units 144 and 146 of the light receiving device 142 are identical, namely, are balanced, the output of the comparing circuit 150 is zero. In case the output of the comparing circuit 150 is zero, the gate circuit 156 is set so as to be disabled.

Next, when the handle is turned to initiate the transfer of the tool slide 8, the passing position of the light flux against the light receiving device 142 changes as the reflecting surface transfers, and the balance of the outputs of the output units 144 and 146 are lost and the output signal from the comparing circuit 150 is transmitted to the motor control circuit 152 and the gate circuit 156, and the gate circuit 156 becomes the energized condition. When the gate circuit 156 is energized, the output pulse of the encoder 154 is transmitted to the reversible counter 158 through the gate circuit 156, and the feed ratio of the tool slide 8 is digitally displayed on the display device 160. On the other hand, the motor control circuit 160 controls the rotation of the motor 148, and the motor 148 transfers the light receiving device 142 in a direction where the output of the comparing circuit 150 becomes zero.

When the tool slide 8 is stopped, the output of the comparing circuit 150 becomes zero, and the rotation of the output shaft of the motor 148 is stopped, and the gate circuit 156 becomes disabled.

The position control of the light receiving device 142 employs the known servo mechanism. Also, the operation electric signal of the input gate circuit 156 can be set for various values.

What is claimed is:

1. In a digital measuring instrument wherein a distance of a transfer unit that moves due to the rotation of a feed shaft of a machine is digitally measured, the improvement comprising: a casing; an encoder which is self-contained within said casing and which converts a rotary motion of said feed shaft into output pulse signals having a directional component; a direction discriminating circuit which is connected to said encoder for determining said directional component of said output pulse signals of said encoder; a reversible counter which is connected to said direction discriminating circuit through counter input gate circuit, said counter input gate circuit being provided between an input terminal of said reversible counter and an output terminal of said encoder; and a counter input gate automatic control means which comprises a storage means for storing a play of the feed shaft of the machine and said storage means is connected to an output of said direction discriminating circuit for incrementing or decrementing the stored play, wherein the disabling and enabling of said counter input gate circuit is determined based on the content of the play stored in said storage means and wherein said reversible counter counts said output pulses from said encoder.

2. A digital measuring instrument as claimed in claim 1, wherein said storage means comprises a preset counter for storing said play of the feed shaft of the machine as a digital preset value, wherein an output of said preset counter is connected to a gate switching control unit of said counter input gate, and wherein said preset counter outputs a signal for energizing said counter input gate circuit when the absolute value of the pulse count value of said preset counter becomes bigger than its preset value, and wherein said preset counter outputs a signal for disabling said counter input gate circuit when the absolute value of the pulse count value of said preset counter becomes smaller than its preset value.

3. A digital measuring instrument as claimed in claim 1, wherein said counter input gate automatic control means includes a means for detecting the movement of said transfer unit, wherein said counter input gate circuit is energized when movement of said transfer unit is detected and wherein said counter input gate circuit is disabled when no movement of said transfer unit is detected.

* * * * *